US012675143B2

(12) United States Patent
Yeh et al.

(10) Patent No.: US 12,675,143 B2
(45) Date of Patent: Jul. 7, 2026

(54) LIFT-UP FOOT MECHANISM FOR HIDEAWAY COOLING FINS

(71) Applicant: DELL PRODUCTS L.P., Round Rock, TX (US)

(72) Inventors: Yi-Chang Yeh, Taipei City (TW); Hao-Chieh Tseng, Keelung City (TW); Chun-Yi Chang, New Taipei City (TW); I-Huei Huang, New Taipei City (TW); Po-Fei Tsai, New Taipei City (TW); Ming-Hao Hsieh, New Taipei City (TW); Chia-Chen Lin, Sanchong District (TW); Jung-Jung Wang, Changhua County (TW); Jer-Yo Lee, Taipei City (TW)

(73) Assignee: Dell Products L.P., Round Rock, TX (US)

( * ) Notice: Subject to any disclaimer, the term of this patent is extended or adjusted under 35 U.S.C. 154(b) by 307 days.

(21) Appl. No.: 18/506,261

(22) Filed: Nov. 10, 2023

(65) Prior Publication Data

US 2025/0155936 A1 May 15, 2025

(51) Int. Cl.
*H05K 7/20* (2006.01)
*G06F 1/16* (2006.01)
*G06F 1/20* (2006.01)

(52) U.S. Cl.
CPC ............ *G06F 1/1681* (2013.01); *G06F 1/203* (2013.01); *H05K 7/20* (2013.01)

(58) Field of Classification Search
CPC .......... G06F 1/1681; G06F 1/203; H05K 7/20

USPC .................................................... 361/679.46
See application file for complete search history.

(56) References Cited

U.S. PATENT DOCUMENTS

| | | | | | |
|---|---|---|---|---|---|
| 5,424,913 | A | * | 6/1995 | Swindler ................. | G06F 1/203 361/679.55 |
| 5,552,960 | A | * | 9/1996 | Nelson ..................... | G06F 1/203 174/16.3 |
| 6,031,716 | A | * | 2/2000 | Cipolla ................. | H01L 23/427 361/679.52 |
| 6,172,871 | B1 | * | 1/2001 | Holung ................. | G06F 1/1632 165/104.33 |
| 6,178,085 | B1 | * | 1/2001 | Leung ..................... | G06F 1/166 235/145 R |
| 6,181,554 | B1 | * | 1/2001 | Cipolla ................. | G06F 1/1616 361/679.55 |
| 6,256,193 | B1 | * | 7/2001 | Janik ..................... | G06F 1/1669 248/922 |

(Continued)

*Primary Examiner* — Anatoly Vortman
(74) *Attorney, Agent, or Firm* — Larson Newman, LLP

(57) ABSTRACT

An information handling system includes a top portion, a heatsink, a base portion, and a foot portion. The top portion transitions between a closed position and an open position. The heatsink includes a main portion and an extension portion. The main portion of the heatsink is located within the base portion, and extension portion of the heatsink extends beyond a surface of the base portion. The foot portion transitions between a retracted position and an extended position. The foot portion is in the retracted position and the extension portion of the heatsink is surrounded by the foot portion when the top portion is in the closed position. The foot portion is in the extended position and the extension portion of the heatsink is viewable when the top portion is in the open position.

20 Claims, 7 Drawing Sheets

(56)                References Cited

U.S. PATENT DOCUMENTS

|  |  |  |  |  |
|---|---|---|---|---|
| 6,292,357 B1 * | 9/2001 | Zamora | H01H 13/807 |
|  |  |  | 361/679.09 |
| 6,351,372 B1 * | 2/2002 | Kim | G06F 1/1616 |
|  |  |  | 400/489 |
| 6,437,978 B1 * | 8/2002 | Ozaki | G06F 1/203 |
|  |  |  | 400/82 |
| 6,496,369 B2 * | 12/2002 | Nakamura | G06F 1/1656 |
|  |  |  | 312/236 |
| 6,515,856 B2 * | 2/2003 | Hidesawa | G06F 1/206 |
|  |  |  | 361/679.48 |
| 7,301,765 B2 * | 11/2007 | Huang | G06F 1/203 |
|  |  |  | 361/679.48 |
| 7,327,568 B2 * | 2/2008 | Lin | H01L 23/467 |
|  |  |  | 361/679.48 |
| 7,876,566 B1 | 1/2011 | Frisch et al. |  |
| 10,642,309 B2 * | 5/2020 | Cheng | G06F 1/203 |
| 10,928,855 B2 * | 2/2021 | Knoppert | H05K 7/20172 |
| 11,262,821 B1 * | 3/2022 | North | G06F 1/3296 |
| 11,262,822 B1 * | 3/2022 | North | H05K 7/20409 |
| 11,435,235 B2 * | 9/2022 | McKittrick | G05B 15/02 |
| 11,630,494 B2 * | 4/2023 | Huang | G06F 1/1626 |
|  |  |  | 361/688 |
| 11,687,133 B2 * | 6/2023 | Kulkarni | H05K 7/20145 |
|  |  |  | 361/679.46 |

|  |  |  |  |  |
|---|---|---|---|---|
| 12,061,502 B2 * | 8/2024 | Ku | F28F 21/02 |
| 2002/0018337 A1 * | 2/2002 | Nakamura | G06F 1/1616 |
|  |  |  | 361/697 |
| 2002/0122298 A1 * | 9/2002 | Cohen | H01L 23/38 |
|  |  |  | 361/688 |
| 2003/0058615 A1 * | 3/2003 | Becker | G06F 1/203 |
|  |  |  | 361/679.48 |
| 2007/0041157 A1 * | 2/2007 | Wang | G06F 1/203 |
|  |  |  | 361/679.48 |
| 2009/0101789 A1 * | 4/2009 | Chen | G06F 1/1616 |
|  |  |  | 248/688 |
| 2011/0075352 A1 * | 3/2011 | Tye | G06F 1/203 |
|  |  |  | 361/679.46 |
| 2013/0027873 A1 * | 1/2013 | Chen | G06F 1/203 |
|  |  |  | 361/695 |
| 2013/0038987 A1 * | 2/2013 | Peng | G06F 1/1632 |
|  |  |  | 361/679.01 |
| 2014/0188283 A1 * | 7/2014 | Ghosh | G06F 1/203 |
|  |  |  | 700/275 |
| 2020/0218224 A1 | 7/2020 | Eiland et al. |  |
| 2020/0337179 A1 * | 10/2020 | Ku | G06F 1/206 |
| 2021/0173456 A1 * | 6/2021 | Kulkarni | H05K 7/20163 |
| 2021/0318174 A1 * | 10/2021 | McKittrick | G06F 1/203 |
| 2021/0333848 A1 * | 10/2021 | Ku | G06F 1/203 |
| 2023/0229213 A1 * | 7/2023 | Chen | H05K 7/20172 |
|  |  |  | 361/695 |

* cited by examiner

LIFT-UP FOOT MECHANISM FOR HIDEAWAY COOLING FINS

FIELD OF THE DISCLOSURE

The present disclosure generally relates to information handling systems, and more particularly relates to a lift-up mechanism for hideaway cooling fins.

BACKGROUND

As the value and use of information continues to increase, individuals and businesses seek additional ways to process and store information. One option is an information handling system. An information handling system generally processes, compiles, stores, or communicates information or data for business, personal, or other purposes. Technology and information handling needs and requirements can vary between different applications. Thus, information handling systems can also vary regarding what information is handled, how the information is handled, how much information is processed, stored, or communicated, and how quickly and efficiently the information can be processed, stored, or communicated. The variations in information handling systems allow information handling systems to be general or configured for a specific user or specific use such as financial transaction processing, airline reservations, enterprise data storage, or global communications. In addition, information handling systems can include a variety of hardware and software resources that can be configured to process, store, and communicate information and can include one or more computer systems, graphics interface systems, data storage systems, networking systems, and mobile communication systems. Information handling systems can also implement various virtualized architectures. Data and voice communications among information handling systems may be via networks that are wired, wireless, or some combination.

SUMMARY

An information handling system includes a top portion, a heatsink, a base portion, and a foot portion. The top portion may transition between a closed position and an open position. The heatsink includes a main portion and an extension portion. The main portion of the heatsink is located within the base portion, and extension portion of the heatsink extends beyond a surface of the base portion. The foot portion may transition between a retracted position and an extended position. The foot portion may be in the retracted position and the extension portion of the heatsink may be surrounded by the foot portion when the top portion is in the closed position. The foot portion may be in the extended position and the extension portion of the heatsink may be viewable when the top portion is in the open position.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings indicates similar or identical items.

DETAILED DESCRIPTION OF THE DRAWINGS

The following description in combination with the Figures is provided to assist in understanding the teachings disclosed herein. The description is focused on specific implementations and embodiments of the teachings and is provided to assist in describing the teachings. This focus should not be interpreted as a limitation on the scope or applicability of the teachings.

Figure 1:
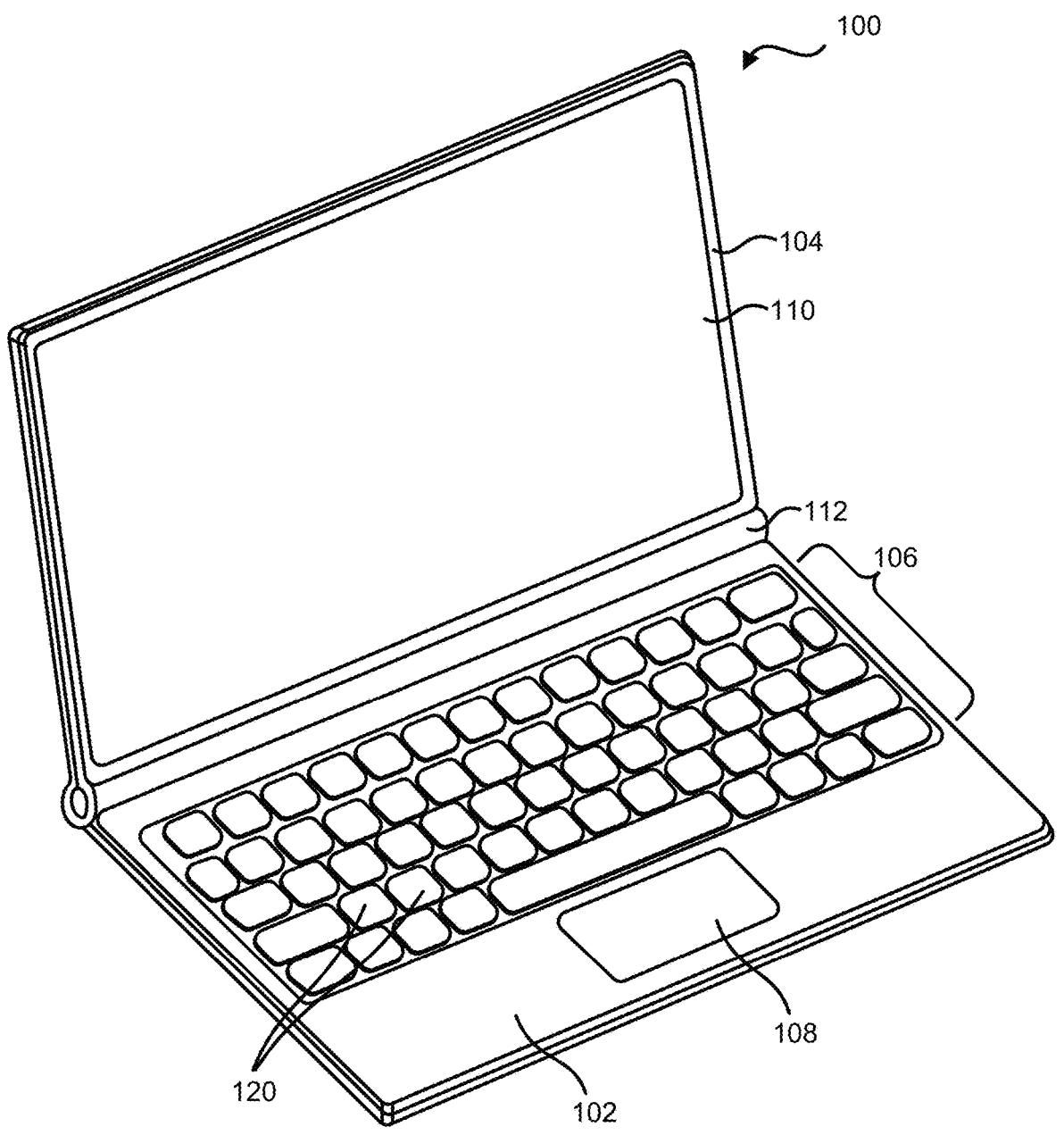
FIG. 1 is a diagram of a portion of an information handling system according to at least one embodiment of the present disclosure.

FIG. 1 illustrates a portion of an information handling system 100 according to at least one embodiment of the present disclosure. For purposes of this disclosure, an information handling system can include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (such as a desktop or laptop), tablet computer, mobile device (such as a personal digital assistant (PDA) or smart phone), server (such as a blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

Information handling system 100 includes a base portion 102 and a top 104. Base portion 102 includes a keyboard 106 and a touchpad 108, and top portion 104 includes a display device 110. In an example, touchpad 108 may be any suitable pointing device. Base portion 102 is connected top portion 104 via a mechanism 112, such as one or more hinges. Keyboard 106 includes multiple keys 120. When the information handling system 100 comprises a 2-in-1 device, mechanism 112 may enable the top portion 104 to be connected to bottom portion 102 for use as a laptop device and may enable the top portion 104 to be detached from bottom portion 102 to enable the top portion 104 to be used as a tablet information handling system. Display device 110 may include one or more light emitting devices, such as, for example, light emitting diodes (LEDs), organic LED (OLED), liquid crystal display (LCD), another type of light emitting device, or any combination thereof.

Figure 2:
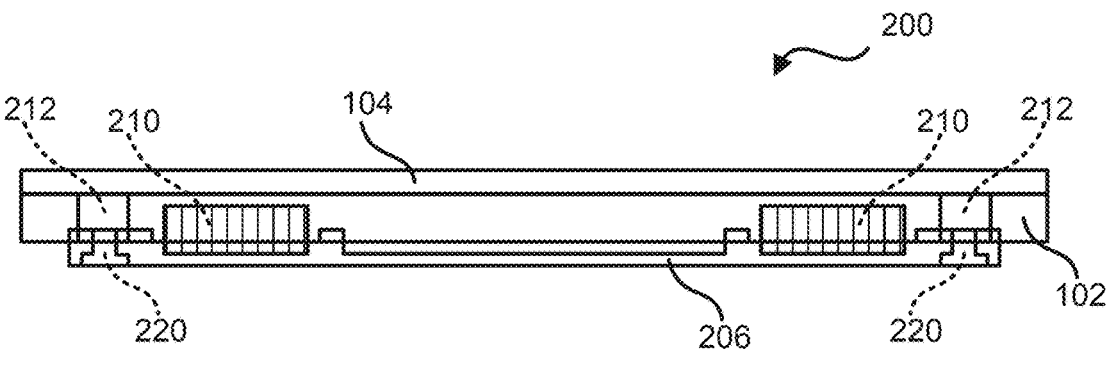
FIGS. 2 and 3 are rear views of an information handling system according to at least one embodiment of the present disclosure.
Figure 3:
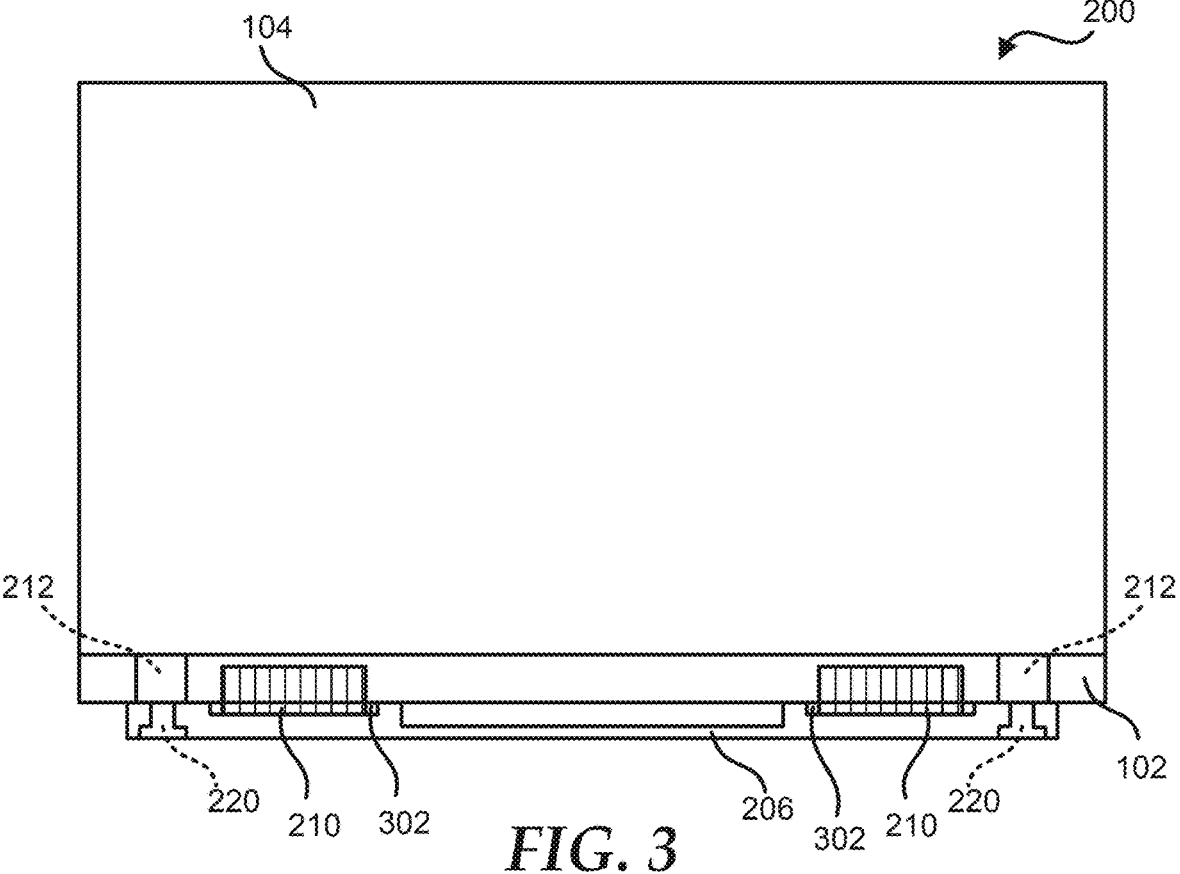

FIGS. 2 and 3 illustrate an information handling system 200 according to at least one embodiment of the present disclosure. Information handling system 200 may be substantially similar to information handling system 100 of FIG. 1. Information handling system 200 includes a base portion 102, a top portion 104, and foot portion 206. Base portion 102 includes heatsinks 210 and housings 212. Information handling system 200 further includes feet 220 that are located within both base portion 102 and foot portion 206. Heatsinks 210 are located within both base portion 102 and below the base portion, such as within foot portion 206. Top portion 104 may hold a display device, such as display device 110 of FIG. 1. Information handling system 200 may include additional components without varying from the scope of this disclosure.

Referring now to FIG. 2, top portion 104 is in a closed position such that the top portion is folded down on base portion 102. While top portion 104 is in the closed position, each foot 220 may be partially retracted within respective housing 212. When feet 220 are retracted, foot portion 206 may be in a retracted position and the foot portion may surround and cover the portions of heatsinks 210 that extend below base portion 102. In certain examples, foot portion 206 may include any suitable components, such as springs, to bias the foot portion in the retracted position. While foot portion 206 is in the retracted position, air cooling of components of information handling system 200 may be cooled as airflow travels through the portions of heatsinks 210 within base portion 102 of the information handling system.

Referring now to FIG. 3, top portion 104 is in an open position such that the top portion is perpendicular from base portion 102. While top portion 104 is in the open position, each foot 220 may be fully extended from housing 212. When feet 220 are extended, the feet may push foot portion 206 toward an extended position and sections 302 of the foot portion may enable the portions of heatsinks 210 that extend below base portion 102 to be exposed. While foot portion 206 is in the extended position, air cooling of components of information handling system 200 may be cooled both airflow traveling through the portions of heatsinks 210 within base portion 102 of the information handling system and through the portions of the heatsinks within sections 302.

Figure 4:
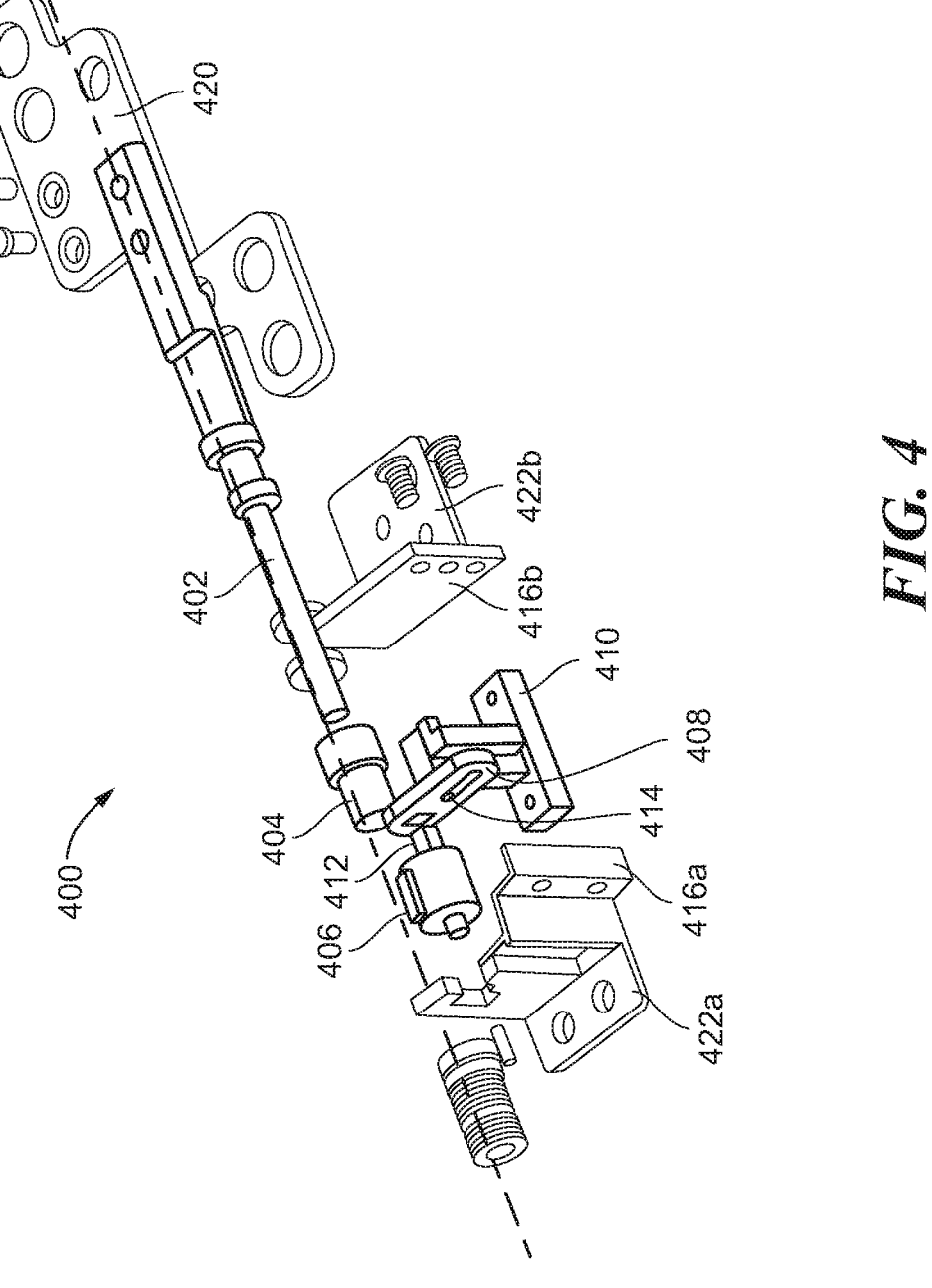
FIG. 4 is an exploded perspective view of a hinge system according to at least one embodiment of the present disclosure.

FIG. 4 illustrates a hinge system 400 according to at least one embodiment of the present disclosure. Hinge system

400 includes a hinge 402, cams 404 and 406, a linkage 408, foot 410, cam pin 412, a linkage pin 414, housing portions 416*a* and 416*b*, a top connection 420, and base connections 422*a* and 422*b*. Housing portions 416*a* and 416*b* may be joined together to form a single housing, such as housing 212 of FIGS. 2 and 3. In an example, the combination of housing portions 416*a* and 416*b* may surround cams 404 and 406, linkage 408, foot 410, cam pin 412, and linkage pin 414. In an example, hinge system may include other components without varying from the scope of this disclosure.

In an example, top connection 420 may be securely attached to a top portion, such as top portion 104 of FIGS. 2 and 3, of an information handling system. Top connection 420 may be securely attached to hinge 402. In this situation, as a top portion rotates, hinge 402 may also rotate. In certain examples, bottom connection 422*a* may securely attach housing portion 416*a* to a base portion, such as base portion 102 of FIGS. 2 and 3. Similarly, bottom connection 422*b* may securely attach housing portion 416*b* to a base portion, such as base portion 102 of FIGS. 2 and 3.

In certain examples, hinge 402 may be inserted within a hole of cam 404 and held in physical communication with the cam. The physical communication between hinger 402 and cam 404 may cause cam 404 to rotate at substantially the same amount as the hinge. In an example, cam 404 may be placed in physical communication with cam 406 such that a rotational force from cam 404 may be transferred to cam 406. Based on this rotational force, cam 406 may rotate substantially the same amount as cam 404. In an example, cam pin 412 may securely mount linkage 408 to cam 406. Based on the secure mounting of linkage 408 on cam 406, the rotation of cam 406 may cause the linkage to rotate in substantially the same direction. For example, as cam 406 rotates an end of linkage opposite cam 406 may rotate in the same direction as the cam. Linkage pin 414 may connect linkage 408 to foot 410. As linkage 408 rotates, linkage pin 414 may cause foot 410 to move up or down within housings 416*a* and 416*b*. In an example, linkage 408 may change the rotation force of cam 406 into a linear force in foot 410.

Figure 5:
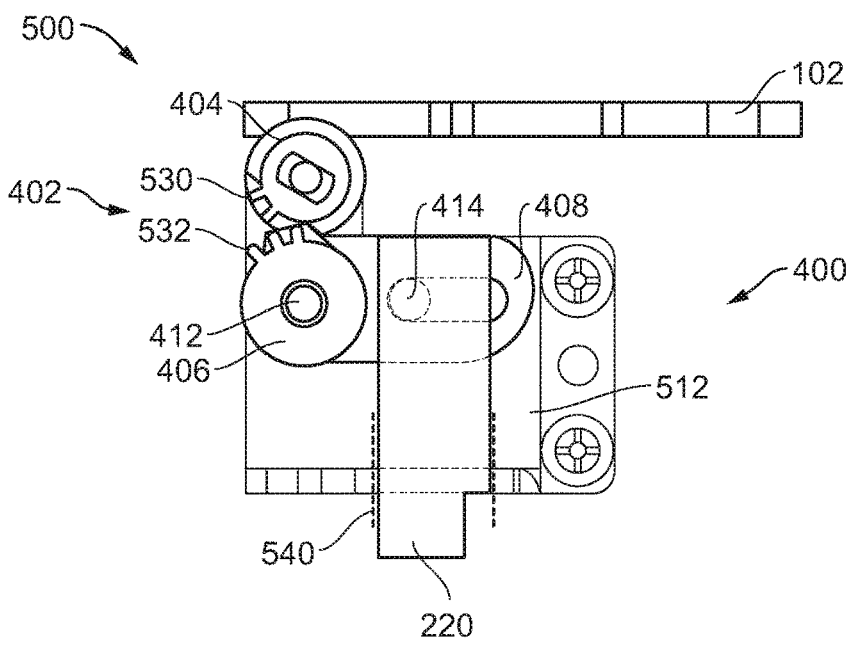
FIG. 5 is cross-sectional view of a top portion and hinge system of an information handling system in a closed position according to at least one embodiment of the present disclosure.

FIG. 5 illustrates a cross-section view of an information handling system 500 including a top portion 102 and hinge system 400 in a closed position according to at least one embodiment of the present disclosure. Information handling system 500 may be substantially similar to information handling system 200 of FIGS. 2 and 3. Hinge system 400 may be substantially similar to hinge system 400 of FIG. 4. Hinge system 400 includes a hinge 402, a housing 512, cams 404 and 406, a linkage 408, a foot 220, a cam pin 412, and a linkage pin 414. Cam 404 includes multiple teeth 530, and cam 406 includes multiple teeth 532. Information handling system 500 may include additional components without varying from the scope of this disclosure.

In an example, top portion 102 is in a closed position and foot 220 is in a retracted position. As described above with respect to FIG. 4, hinge 512 is securely mounted to top portion 102, such that movement of the top portion from the closed position to an open position may cause a rotation of the hinge. While top portion 102 is in the closed position, cams 404 and 406 may be positioned such that teeth 530 and 532 are not in physical communication with one another. While teeth 530 and 532 are not in physical communication, a foot portion, such as foot portion 206 of FIGS. 2 and 3, may force foot 220 upwards within housing 512 and bias the foot toward a retracted position.

In certain examples, linkage pin 414 may be securely attached to foot 220 and the linkage pin may slide within a channel of linkage 408. In an example, when linkage pin 414 is at a first end of the channel of linkage 408, the linkage may be substantially parallel with a top portion of housing 512 and substantially parallel with top portion 102. In certain examples, housing 512 may include a channel 540 that foot 220 may be located within. While top portion is in the closed position and hinge system 400 is in the retracted position, a foot portion may surround a portion of a heat sink of the information handling system as illustrated in FIG. 6.

Figure 6:
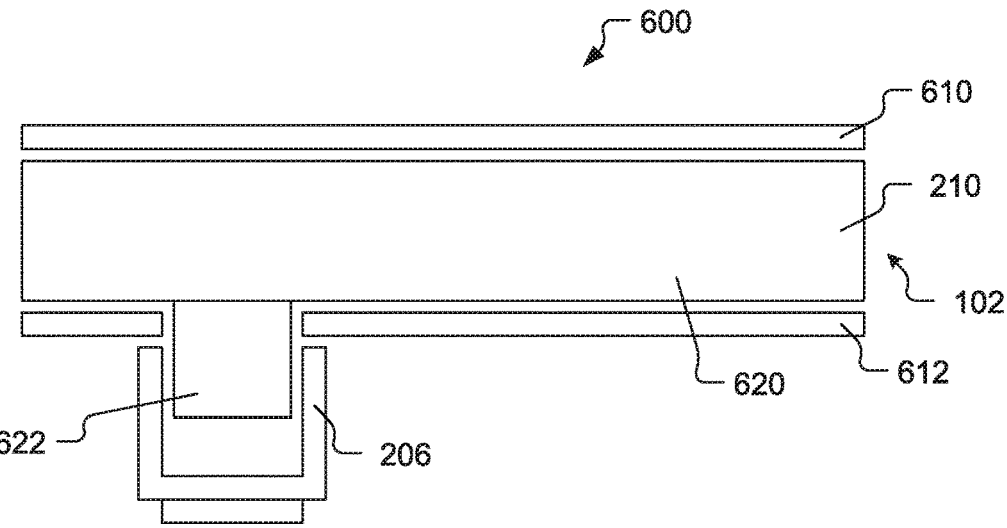
FIG. 6 is a cross-sectional view of a heat sink with a base portion of an information handling system in a closed position according to at least one embodiment of the present disclosure.

FIG. 6 illustrates a cross-section of a portion of an information handling system 600 according to at least one embodiment of the present disclosure. In an example, information handling system 600 may be substantially similar to information handling system 200 of FIGS. 2 and 3. Information handling system 600 includes a base portion 102 and a foot portion 206. Base portion includes a c-cover 610, a d-cover 612, and a heatsink 210. Heatsink 210 includes a main portion 620 and an extension portion 622. Information handling system 600 may include additional components without varying from the scope of this disclosure.

In an example, main portion 620 of heatsink 210 may located in between c-cover 610 and d-cover 612. Extension portion 622 may extend substantially perpendicularly away from main portion 620. In an example, extension portion 622 may extend between an opening in d-cover 612. When information handling system 600 is in a closed position, foot portion 206 may be in physical contact with d-cover 612 as shown in FIG. 6. In this position, extension portion 622 may be surrounded by foot portion 206, such that an airflow is not able to escape from within base portion 102 via the extension portion of heatsink 210. Instead, heatsink 210 may provide heat dissipation within information handling system 600 as an airflow travels through main portion 620 of the heatsink.

Figure 7:
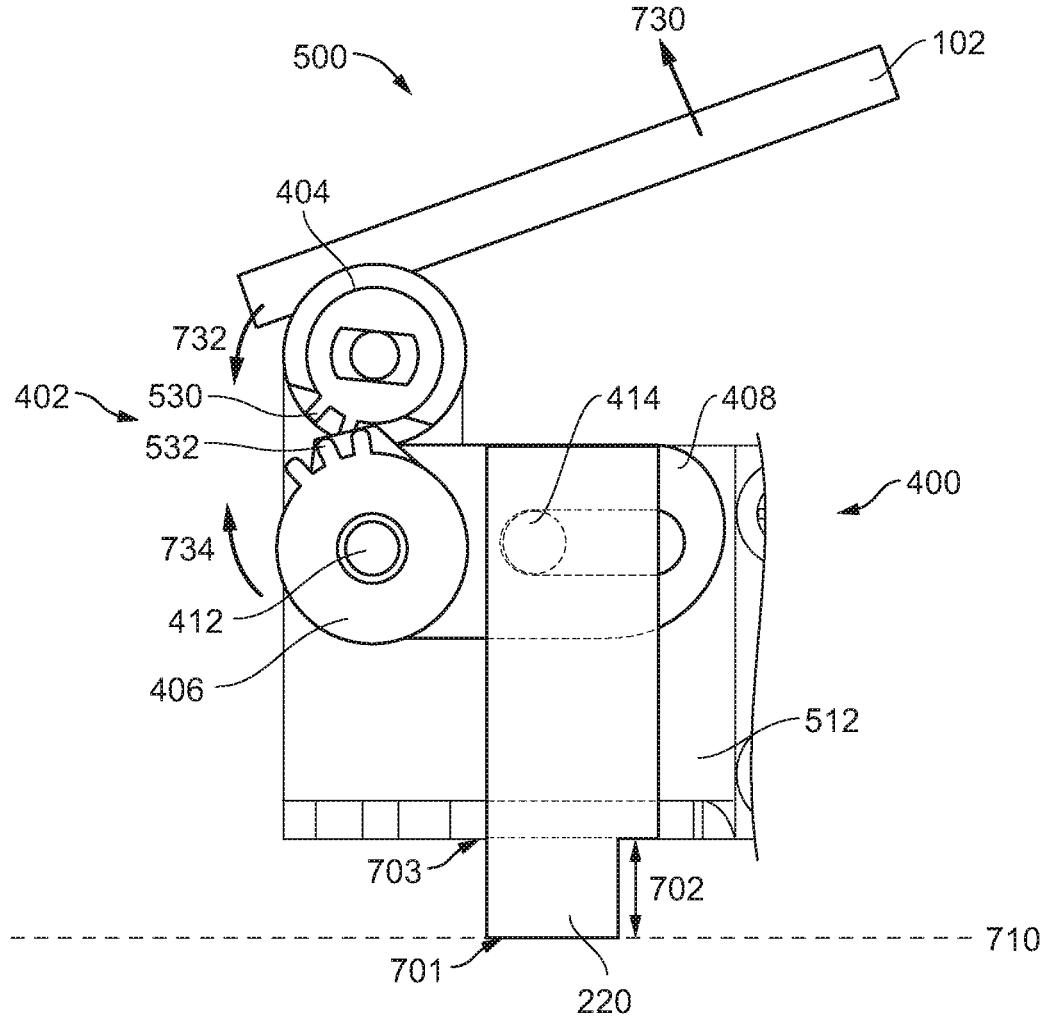
FIG. 7 is a cross-sectional view of a top portion and hinge system of an information handling system in a second stage according to at least one embodiment of the present disclosure.

FIG. 7 illustrates a cross-section view of information handling system 500 with top portion 102 and hinge system 400 in an intermediate position according to at least one embodiment of the present disclosure. As shown in FIG. 7, a bottom surface 701 of foot 220 may be a particular distance 702 below a bottom surface 703 of housing 512. In certain examples, when foot 220 is in an initial position, bottom surface 701 of foot 220 may be located along line 710. In an example, when top portion 102 is in the intermediate position, the top portion may be at any suitable angle from the base portion, such as 15°, 200, 25°, or the like.

In an example, a force 730 may be exerted on top portion 102. In response to force 730, top portion 102 may transition from the closed position to the intermediate position. As top portion 102 transitions to the intermediate position, hinge 402 may cause cam 404 to rotate in direction of arrow 732. The rotation of cam 404 may cause teeth 530 to be placed in physical communication with teeth 532 of cam 406. In an example, teeth 530 and 532 may cause cam 406 to rotate in the direction of arrow 734.

Figure 8:
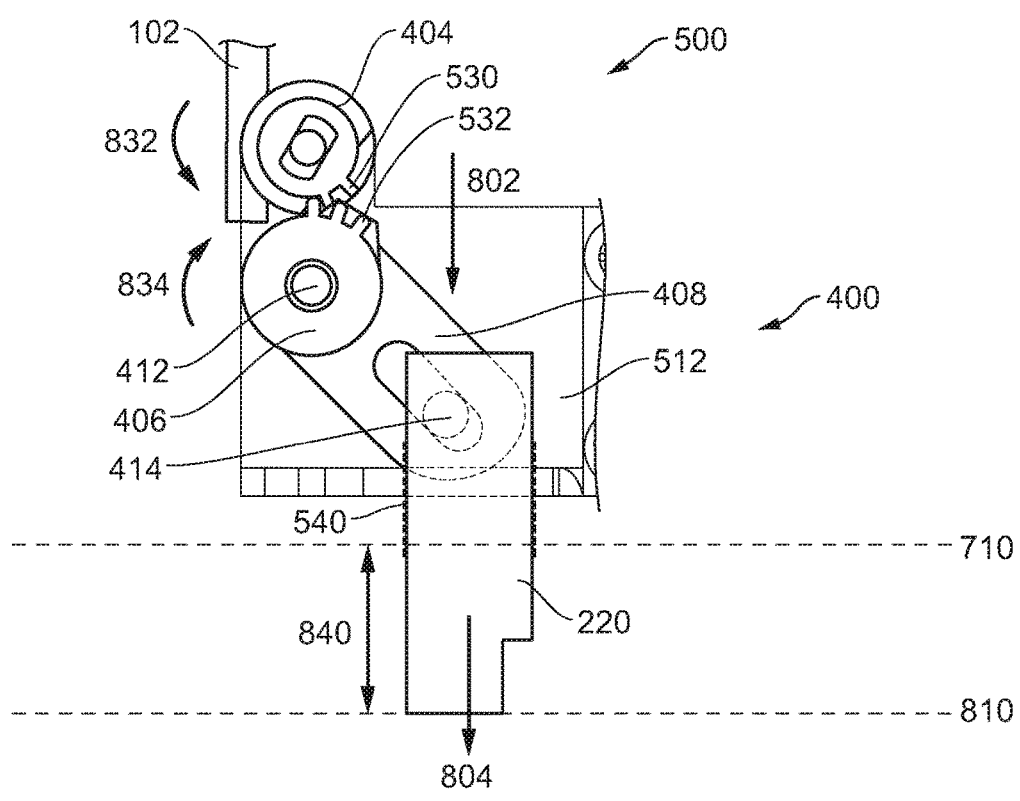
FIG. 8 is a cross-sectional view of a top portion and hinge system of an information handling system in a third stage according to at least one embodiment of the present disclosure.

FIG. 8 illustrates a cross-section view of information handling system 500 with top portion 102 in an open position and hinge system 400 in an extended position according to at least one embodiment of the present disclosure. In an example, the position of top portion 102 may cause cam 404 to rotate in the direction of arrow 832 and cam 406 to rotate in the direction arrow 834. In an example, when top portion 102 is in the open position, the top portion may be at any suitable angle from the base portion, such as 90°, 135°, or the like. In certain examples, linkage 408 may be rigidly attached to cam 406 via cam pin 412. As cam 406 rotates in the direction of arrow 834, an end of linkage 408 that is opposite cam 406 may move downward in the direction of arrow 802. In an example, linkage 408 may change the rotation force of cam 406 into a linear force in foot 220. For example, the movement of linkage 408 may push linkage pin 414 downward, which in turn may push foot 220 downward in direction of 804.

As foot 220 is pushed downward, a base portion, such as base portion 102 of FIG. 3 or 102 of FIG. 6, may be lifted up as will be described with respect to FIG. 9 below. In certain examples, the movement of foot 220 may be controlled in part by channel 540. When foot 220 is in the extended position, bottom surface 701 of foot 220 may be located at a position indicated by line 810. In an example, bottom surface 701 of foot 220 may move from line 710 to line 810 such that the movement is a distance 840. In certain examples, distance 840 may correspond to a length that base portion 102 of FIG. 9 may be lifted as will be described with respect to FIG. 9 below.

Figure 9:
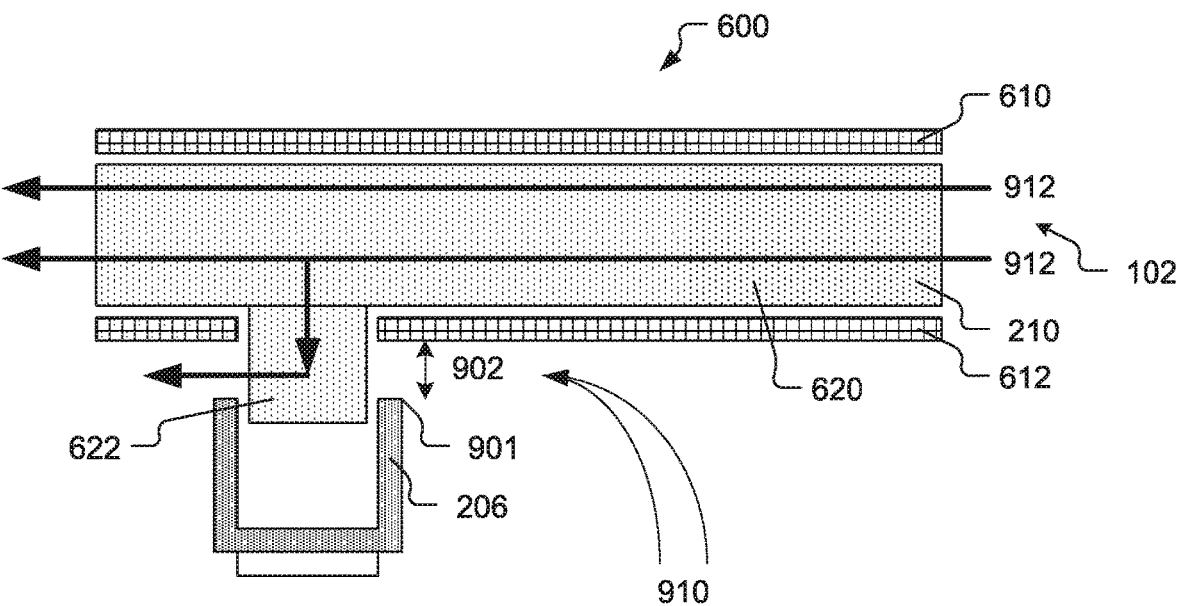
FIG. 9 is a cross-sectional view of heat sink with a base portion of an information handling system in a second stage according to at least one embodiment of the present disclosure.

FIG. 9 illustrates a cross-section of a portion of information handling system 600 in an open position according to at least one embodiment of the present disclosure. In an example, as the information handling system 600 transitions to the open position, foot portion 206 may move away from a bottom surface of d-cover 612 to transition to an extended position. When information handling system 600 is in the open position and foot portion 206 is in the extended position, a top edge 901 of foot portion 206 may be separated from a bottom surface of d-cover 612 by a particular amount or distance 902. The transition of foot portion 206 to the extended position may lift base portion and provide more air intake of an airflow 910 to a fan of information handling system 600. Airflow 910 may combine with airflow 912 traveling through main portion 620 of heatsink 210. In an example, the revealed extension portion 622 within space 902 may allow more heat dissipation within information handling system 600.

Figure 10:
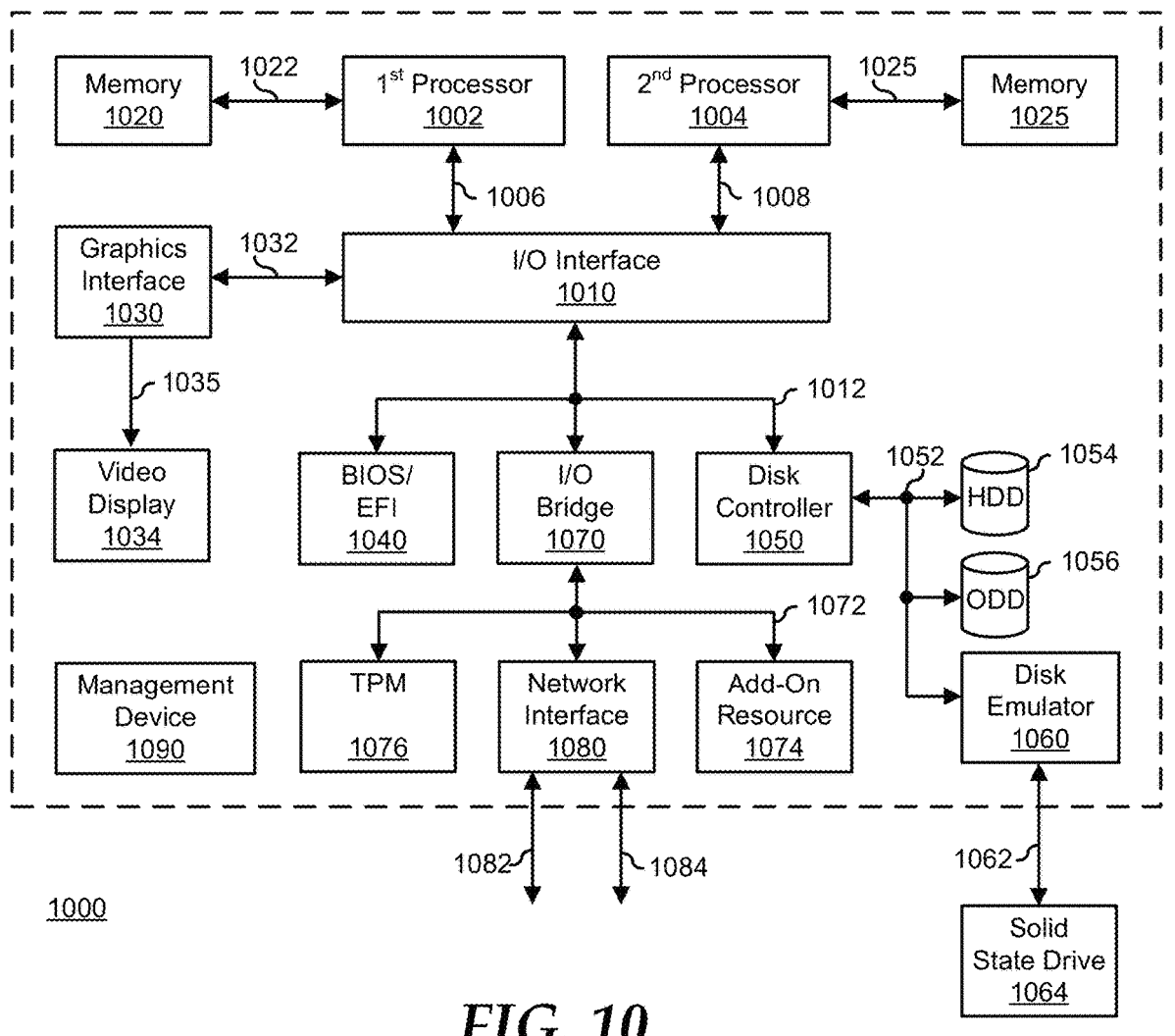
FIG. 10 is a block diagram of a general information handling system according to an embodiment of the present disclosure.

FIG. 10 shows a generalized embodiment of an information handling system 1000 according to an embodiment of the present disclosure. For purpose of this disclosure an information handling system can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 1000 can be a personal computer, a laptop computer, a smart phone, a tablet device or other consumer electronic device, a network server, a network storage device, a switch router or other network communication device, or any other suitable device and may vary in size, shape, performance, functionality, and price. Further, information handling system 1000 can include processing resources for executing machine-executable code, such as a central processing unit (CPU), a programmable logic array (PLA), an embedded device such as a System-on-a-Chip (SoC), or other control logic hardware. Information handling system 1000 can also include one or more computer-readable medium for storing machine-executable code, such as software or data. Additional components of information handling system 1000 can include one or more storage devices that can store machine-executable code, one or more communications ports for communicating with external devices, and various input and output (I/O) devices, such as a keyboard, a mouse, and a video display. Information handling system 1000 can also include one or more buses operable to transmit information between the various hardware components.

Information handling system 1000 can include devices or modules that embody one or more of the devices or modules described below and operates to perform one or more of the methods described below. Information handling system 1000 includes a processors 1002 and 1004, an input/output (I/O) interface 1010, memories 1020 and 1025, a graphics interface 1030, a basic input and output system/universal extensible firmware interface (BIOS/UEFI) module 1040, a disk controller 1050, a hard disk drive (HDD) 1054, an optical disk drive (ODD) 1056, a disk emulator 1060 connected to an external solid state drive (SSD) 1062, an I/O bridge 1070, one or more add-on resources 1074, a trusted platform module (TPM) 1076, a network interface 1080, a management device 1090, and a power supply 1095. Processors 1002 and 1004, I/O interface 1010, memory 1020, graphics interface 1030, BIOS/UEFI module 1040, disk controller 1050, HDD 1054, ODD 1056, disk emulator 1060, SSD 1062, I/O bridge 1070, add-on resources 1074, TPM 1076, and network interface 1080 operate together to provide a host environment of information handling system 1000 that operates to provide the data processing functionality of the information handling system. The host environment operates to execute machine-executable code, including platform BIOS/UEFI code, device firmware, operating system code, applications, programs, and the like, to perform the data processing tasks associated with information handling system 1000.

In the host environment, processor 1002 is connected to I/O interface 1010 via processor interface 1006, and processor 1004 is connected to the I/O interface via processor interface 1008. Memory 1020 is connected to processor 1002 via a memory interface 1022. Memory 1025 is connected to processor 1004 via a memory interface 1027. Graphics interface 1030 is connected to I/O interface 1010 via a graphics interface 1032 and provides a video display output 1036 to a video display 1034. In a particular embodiment, information handling system 1000 includes separate memories that are dedicated to each of processors 1002 and 1004 via separate memory interfaces. An example of memories 1020 and 1030 include random access memory (RAM) such as static RAM (SRAM), dynamic RAM (DRAM), non-volatile RAM (NV-RAM), or the like, read only memory (ROM), another type of memory, or a combination thereof.

BIOS/UEFI module 1040, disk controller 1050, and I/O bridge 1070 are connected to I/O interface 1010 via an I/O channel 1012. An example of I/O channel 1012 includes a Peripheral Component Interconnect (PCI) interface, a PCI-Extended (PCI-X) interface, a high-speed PCI-Express (PCIe) interface, another industry standard or proprietary communication interface, or a combination thereof. I/O interface 1010 can also include one or more other I/O interfaces, including an Industry Standard Architecture (ISA) interface, a Small Computer Serial Interface (SCSI) interface, an Inter-Integrated Circuit (I2C) interface, a System Packet Interface (SPI), a Universal Serial Bus (USB), another interface, or a combination thereof. BIOS/UEFI module 1040 includes BIOS/UEFI code operable to detect resources within information handling system 1000, to provide drivers for the resources, initialize the resources, and access the resources. BIOS/UEFI module 1040 includes code that operates to detect resources within information handling system 1000, to provide drivers for the resources, to initialize the resources, and to access the resources.

Disk controller 1050 includes a disk interface 1052 that connects the disk controller to HDD 1054, to ODD 1056, and to disk emulator 1060. An example of disk interface

1052 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 1060 permits SSD 1064 to be connected to information handling system 1000 via an external interface 1062. An example of external interface 1062 includes a USB interface, an IEEE 4394 (Firewire) interface, a proprietary interface, or a combination thereof. Alternatively, solid-state drive 1064 can be disposed within information handling system 1000.

I/O bridge 1070 includes a peripheral interface 1072 that connects the I/O bridge to add-on resource 1074, to TPM 1076, and to network interface 1080. Peripheral interface 1072 can be the same type of interface as I/O channel 1012 or can be a different type of interface. As such, I/O bridge 1070 extends the capacity of I/O channel 1012 when peripheral interface 1072 and the I/O channel are of the same type, and the I/O bridge translates information from a format suitable to the I/O channel to a format suitable to the peripheral channel 1072 when they are of a different type. Add-on resource 1074 can include a data storage system, an additional graphics interface, a network interface card (NIC), a sound/video processing card, another add-on resource, or a combination thereof. Add-on resource 1074 can be on a main circuit board, on separate circuit board or add-in card disposed within information handling system 1000, a device that is external to the information handling system, or a combination thereof.

Network interface 1080 represents a NIC disposed within information handling system 1000, on a main circuit board of the information handling system, integrated onto another component such as I/O interface 1010, in another suitable location, or a combination thereof. Network interface device 1080 includes network channels 1082 and 1084 that provide interfaces to devices that are external to information handling system 1000. In a particular embodiment, network channels 1082 and 1084 are of a different type than peripheral channel 1072 and network interface 1080 translates information from a format suitable to the peripheral channel to a format suitable to external devices. An example of network channels 1082 and 1084 includes InfiniBand channels, Fibre Channel channels, Gigabit Ethernet channels, proprietary channel architectures, or a combination thereof. Network channels 1082 and 1084 can be connected to external network resources (not illustrated). The network resource can include another information handling system, a data storage system, another network, a grid management system, another suitable resource, or a combination thereof.

Management device 1090 represents one or more processing devices, such as a dedicated baseboard management controller (BMC) System-on-a-Chip (SoC) device, one or more associated memory devices, one or more network interface devices, a complex programmable logic device (CPLD), and the like, which operate together to provide the management environment for information handling system 1000. In particular, management device 1090 is connected to various components of the host environment via various internal communication interfaces, such as a Low Pin Count (LPC) interface, an Inter-Integrated-Circuit (I2C) interface, a PCIe interface, or the like, to provide an out-of-band (OOB) mechanism to retrieve information related to the operation of the host environment, to provide BIOS/UEFI or system firmware updates, to manage non-processing components of information handling system 1000, such as system cooling fans and power supplies. Management device 1090 can include a network connection to an external management system, and the management device can communicate with the management system to report status information for information handling system 1000, to receive BIOS/UEFI or system firmware updates, or to perform other task for managing and controlling the operation of information handling system 1000.

Management device 1090 can operate off of a separate power plane from the components of the host environment so that the management device receives power to manage information handling system 1000 when the information handling system is otherwise shut down. An example of management device 1090 include a commercially available BMC product or other device that operates in accordance with an Intelligent Platform Management Initiative (IPMI) specification, a Web Services Management (WSMan) interface, a Redfish Application Programming Interface (API), another Distributed Management Task Force (DMTF), or other management standard, and can include an Integrated Dell Remote Access Controller (iDRAC), an Embedded Controller (EC), or the like. Management device 1090 may further include associated memory devices, logic devices, security devices, or the like, as needed, or desired.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

What is claimed is:

1. An information handling system comprising:
   a top portion to transition between a closed position and an open position;
   a heatsink including a main portion and an extension portion;
   a base portion coupled to the top portion, wherein the main portion of the heatsink is located within the base portion, and the extension portion of the heatsink extends below a bottom surface of the base portion; and
   a foot portion coupled to the top portion, the foot portion to transition between a retracted position and an extended position, wherein the foot portion is in the retracted position and a section of the extension portion of the heatsink that extends below the bottom surface is surrounded and covered on all lateral sides and a bottom surface by the foot portion when the top portion is in the closed position, and the foot portion is in the extended position and the extension portion of the heatsink is not covered by the foot portion in an area defined by a separation between the bottom surface and a top edge of the foot portion when the top portion is in the open position.

2. The information handling system of claim 1, further comprising: a hinge system in physical communication with the top portion, with the base portion, and with the foot portion, wherein a force is exerted on the hinge system during the transition of the top portion from the closed position and the open position.

3. The information handling system of claim 2, wherein the hinge system transfers the force to the foot portion, wherein the force causes the foot portion to transition from the retracted position to the extension position.

4. The information handling system of claim 1, further comprising: a foot in physical communication with the foot portion, wherein the foot exerts a force on the foot portion to transition the foot portion to the extended position.

5. The information handling system of claim 1, wherein the base portion is lifted as the foot portion transitions to the extended position.

6. The information handling system of claim 1, wherein an amount of airflow within in the heatsink increases when the foot portion is in the extended position.

7. The information handling system of claim 1, wherein heat dissipation is increased by the extension portion of the heatsink when the extension portion is visible.

8. The information handling system of claim 1, wherein a top surface of the foot portion is in physical communication with a bottom surface of the base portion when the foot portion is in retracted position, and the top surface is not in physical communication with the bottom surface when the foot portion is in the extended position.

9. An information handling system comprising:
   a top portion to transition between a closed position and an open position;
   a heatsink including a main portion and an extension portion;
   a base portion coupled to the top portion, wherein the main portion of the heatsink is located within the base portion, and the extension portion of the heatsink extends below a bottom surface of the base portion; and
   a foot portion coupled to the top portion, the foot portion to transition between a retracted position and an extended position, wherein the foot portion is in the retracted position and a section of the extension portion of the heatsink that extends below the bottom of the bottom surface is surrounded and covered on all lateral sides and a bottom surface by the foot portion when the top portion is in the closed position, wherein the foot portion is in the extended position and the extension portion of the heatsink is not covered by the foot portion in an area defined by a separation between the bottom surface and a top edge of the foot portion when the top portion is in the open position, wherein an amount of airflow within the heatsink increases when the foot portion is in the extended position, and wherein heat dissipation is increased by the extension portion of the heatsink when the extension portion is visible.

10. The information handling system of claim 9, further comprising: a hinge system in physical communication with the top portion, with the base portion, and with the foot portion, wherein a force is exerted on the hinge system during the transition of the top portion from the closed position and the open position.

11. The information handling system of claim 10, wherein the hinge system transfers the force to the foot portion, wherein the force causes the foot portion to transition from the retracted position to the extension position.

12. The information handling system of claim 10, wherein the hinge system includes a linkage to change a rotational force from the top portion into a linear force on the foot portion.

13. The information handling system of claim 10, wherein the hinge system includes a hinge to rotate at a same rate as the top portion.

14. The information handling system of claim 9, further comprising: a foot in physical communication with the foot portion, wherein the foot exerts a force on the foot portion to transition the foot portion to the extended position.

15. The information handling system of claim 9, wherein the base portion is lifted as the foot portion transitions to the extended position.

16. The information handling system of claim 9, wherein a top surface of the foot portion is in physical communication with a bottom surface of the base portion when the foot portion is in retracted position, and the top surface is not physical communication with the bottom surface when the foot portion is in the extended position.

17. An information handling system comprising:
    a top portion to transition between a closed position and an open position;
    a heatsink including a main portion and an extension portion;
    a base portion coupled to the top portion, wherein the main portion of the heatsink is located within the base portion, and the extension portion of the heatsink extends below a bottom surface of the base portion;
    a foot portion coupled to the top portion, the foot portion to transition between a retracted position and an extended position, wherein the foot portion is in the retracted position and a section of the extension portion of the heatsink that extends below the bottom of the bottom surface is surrounded and covered on all lateral sides and a bottom surface by the foot portion when the top portion is in the closed position, and the foot portion is in the extended position and the extension portion of the heatsink is not covered by the foot portion in an area defined by a separation between the bottom surface and a top edge of the foot portion when the top portion is in the open position;
    a foot in physical communication with the foot portion, wherein the foot exerts a force on the foot portion to transition the foot portion to the extended position; and
    a hinge system in physical communication with the top portion, with the base portion, and with the foot, wherein a first force is exerted on the hinge system during the transition of the top portion from the closed position and the open position and the hinge system exerts a second force on the foot portion via the foot as the top portion the transitions from the closed position to the open position.

18. The information handling system of claim 17, wherein an amount of airflow within in the heatsink increases when the foot portion is in the extended position.

19. The information handling system of claim 17, wherein a top surface of the foot portion is in physical communication with a bottom surface of the base portion when the foot portion is in retracted position, and the top surface is not in physical communication with the bottom surface when the foot portion is in the extended position.

20. The information handling system of claim 17, wherein the base portion is lifted as the foot portion transitions to the extended position.

* * * * *